United States Patent
Yufu et al.

(10) Patent No.: US 6,888,419 B2
(45) Date of Patent: May 3, 2005

(54) VARIABLE ATTENUATOR DEVICE HAVING SUBSTANTIALLY CONSTANT IMPEDANCE

(75) Inventors: Yasuyuki Yufu, Tokyo (JP); Kotaro Takenaga, Tokyo (JP)

(73) Assignee: Hitachi Kokusai Electric, Inc., Tokyo (JP)

(*) Notice: Subject to any disclaimer, the term of this patent is extended or adjusted under 35 U.S.C. 154(b) by 288 days.

(21) Appl. No.: 10/104,251

(22) Filed: Mar. 22, 2002

(65) Prior Publication Data

US 2003/0030507 A1 Feb. 13, 2003

(30) Foreign Application Priority Data

Aug. 8, 2001 (JP) .................................... 2001-241046

(51) Int. Cl.[7] ................................................ H01P 1/22
(52) U.S. Cl. .................................. 333/81 R; 333/81 A
(58) Field of Search ............................. 333/81 R, 81 A

(56) References Cited

U.S. PATENT DOCUMENTS 3,890,589 A * 6/1975 Kogo et al. .................... 338/89
3,944,962 A * 3/1976 Honda ......................... 338/126
3,969,666 A * 7/1976 Simon ........................ 333/81 R
RE29,018 E * 10/1976 Garuts ........................ 333/81 A
3,984,793 A * 10/1976 Hannaford et al. ......... 333/81 A

* cited by examiner

Primary Examiner—Patricia Nguyen
(74) Attorney, Agent, or Firm—Knoble & Yoshida, LLC

(57) ABSTRACT

An attenuator of the current invention allows the adjustment in attenuation at a constant impedance level. The attenuator includes at least three variable resistors. Two of the three variable resistors have the substantially same linear resistance characteristics and are controlled in a substantially identical manner. One of the three variable resistors has a non-linear resistance characteristic and is controlled concurrently with the above two variable resistors. As a result of the above resistance characteristics and control, the attenuation is adjusted with respect to the resistance while impedance is maintained at a constant level.

12 Claims, 4 Drawing Sheets

VARIABLE ATTENUATOR DEVICE HAVING SUBSTANTIALLY CONSTANT IMPEDANCE

FIELD OF THE INVENTION

The current invention is generally related to a variable attenuator, and more particularly related to a variable attenuator that changes resistance without a change in impedance.

BACKGROUND OF THE INVENTION

In general, attenuators adjust a wave form in an electronic circuit. FIG. 1 shows a circuit diagram for a prior art T-shaped attenuator 1. The T-shaped attenuator 1 includes a resistor 3 on a line 2, a resistor 4 in series with the resistor 3, and a grounded resistor 5 between the resistors 3 and 4. The resistors 3 and 4 have a variable resistance value, and their resistance values change in the same manner. On the other hand, the resistor 5 has a fixed resistance value.

Referring to FIG. 2, a circuit diagram illustrates another prior art attenuator. In general, the arrangement of resistors 6, 7 and 8 is in a T-shape as shown in the above prior art attenuator of FIG. 1. However, the resistors 6 and 7 are fixed in their resistance while the resistor 8 is variable.

In either of the above two prior art attenuators, the following relationships as shown in Equations (1) and (2) are held true among the resistances R1Ω for the resistor 3 or 6, the resistance R2Ω for the resistor 4 or 7, the resistance R3Ω for the resistor 5 or 8, the attenuation L dB and the impedance Z Ω:

$$R1=R2=(1-10^{-L/20})Z/(1+10^{-L/20}) \quad (1)$$

$$R3=(2\times 10^{-L/20})Z/(1-10^{L/10}) \quad (2)$$

As shown above in Equations (1) and (2), the attenuation L is changed by altering the R1, R2 or R3 value. The resistance values R1, R2 and R3, the impedance value Z and the attenuation value L are also interrelated. For example, in FIG. 1, when the attenuation L is changed by adjusting the resistance values in R1=R2 of Equation (1), the attenuation L in Equation (2) also changes. With the fixed resistance value R3, the impedance Z changes as the resistance values R1 and R2 are adjusted. In other words, the impedance is unmatched, and a desired attenuation amount is no longer obtained for the adjacent circuits.

For the above reason, it remains to be desired to have an attenuator that enables to vary the attenuation without influencing the impedance.

SUMMARY OF THE INVENTION

In order to solve the above and other problems, according to a first aspect of the current invention, a method of varying an attenuation level with respect to impedance in an attenuator, including the steps of: placing a substantially identical pair of a first variable resistor and a second variable resistor in series in the attenuator; grounding a third variable resistor between the first variable resistor and the second variable resistor; varying resistance of the first variable resistor and the second variable resistor in a substantially identical and linear manner; and further varying resistance of the third variable resistor concurrently with the first variable resistor and the second resistor in a substantially inverse manner to adjust the attenuation while the impedance amount is maintained at a constant level.

According to a second aspect of the current invention, an attenuator for varying an attenuation level with respect to impedance, including: a first variable resistor having a cylindrical shape for varying with a first range of resistance; a second variable resistor connected in series with the first variable resistor having the cylindrical shape for varying with the first range of resistance; a third variable resistor grounded and connected between the first variable resistor and the second variable resistor having a cylindrical shape for varying with the second range of resistance, the first variable resistor, the second variable resistor and the third resistor forming a cylinder and sharing a common central axis; and a movable fitting piece placed in the cylinder for moving along the central axis to vary the resistance of the first variable resistor and the second variable resistor in a substantially identical and linear manner, the movable fitting piece concurrently varying the resistance of the third variable resistor with the first variable resistor and the second resistor in a substantially inverse manner to adjust the attenuation while the impedance is maintained at a constant level.

According to a third aspect of the current invention, an attenuator for varying an attenuation level with respect to impedance, including: a board having a flat surface along a predetermined axis; a first variable resistor located on the board and having a rectangular shape for varying with a first range of resistance; a second variable resistor located on the board and connected in series with the first variable resistor, the second variable resistor having the rectangular shape for varying with the first range of resistance; a third variable resistor located on the board being grounded at one end, the other end of the third variable resistor being connected between the first variable resistor and the second variable resistor, the third variable resistor having a predetermined shape for varying with the second range of resistance; and a movable fitting piece placed on the board for contacting the first variable resistor, the second variable resistor and the third variable resistor, the movable fitting piece moving along the central axis to vary the resistance of the first variable resistor and the second variable resistor in a substantially identical and linear manner, the movable fitting piece concurrently varying the resistance of the third variable resistor with the resistance of the first variable resistor and the second resistor in a substantially inverse manner to adjust the attenuation while the impedance is maintained at a constant level.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

DETAILED DESCRIPTION OF THE PREFERRED EMBODIMENT(S)

Figure 1:
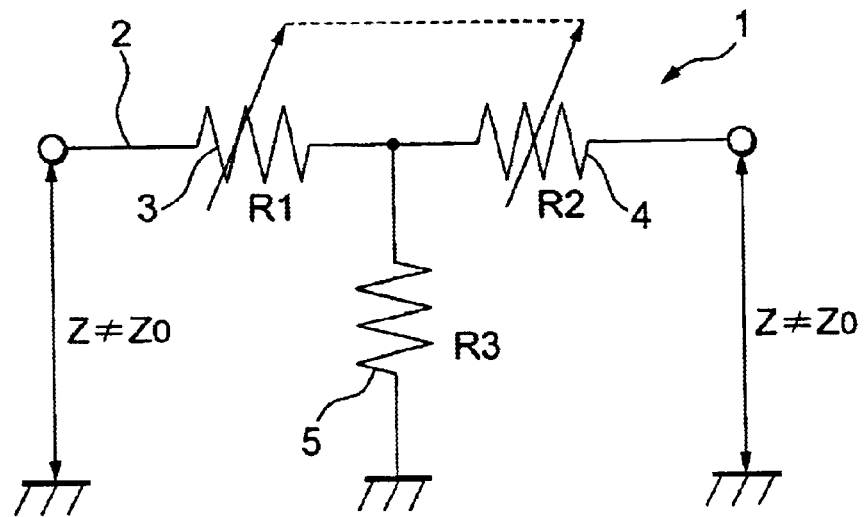
FIG. 1 is a circuit diagram illustrating a prior art T-shaped attenuator.
Figure 2:
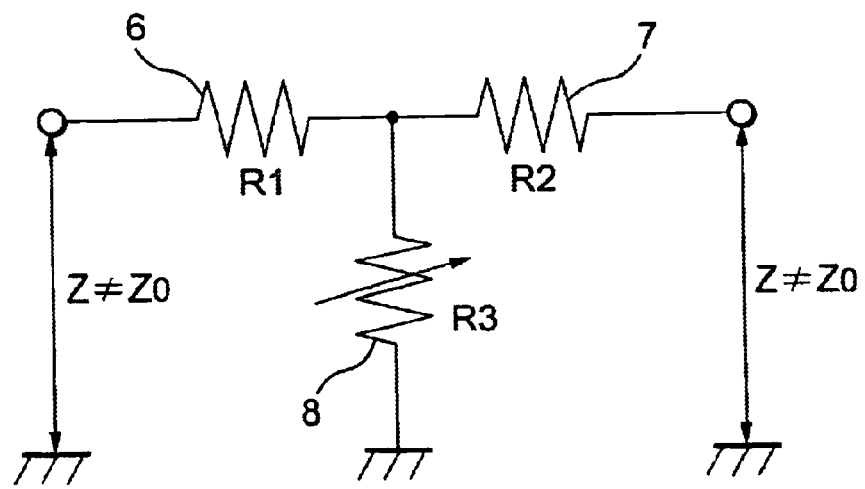
FIG. 2 is a circuit diagram illustrating another prior art attenuator.
Figure 3:
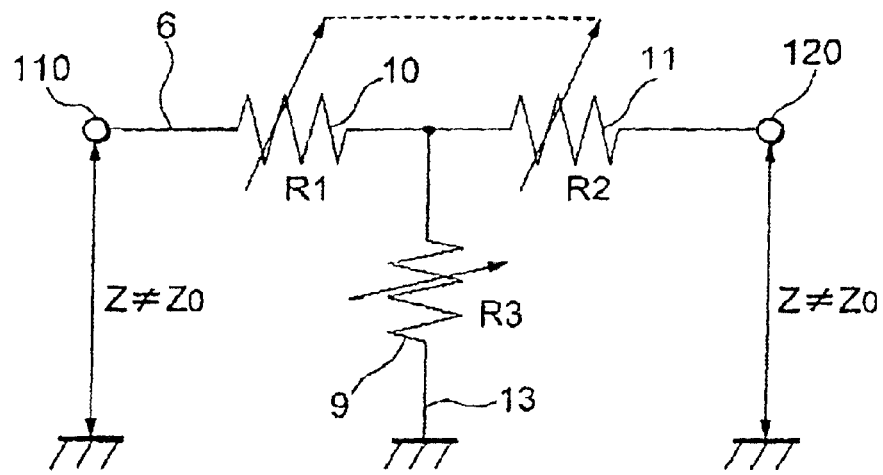
FIG. 3 is a circuit diagram illustrating a first preferred embodiment of the T-shaped attenuator according to the current invention.

Referring now to the drawings, wherein like reference numerals designate corresponding structures throughout the views, and referring in particular to FIG. 3, a circuit diagram illustrates a first preferred embodiment of the T-shaped attenuator according to the current invention. The first preferred embodiment includes a first variable resistor 10 and a second variable resistor 11 that are serially placed on a line 6 connecting the terminals 110 and 120. Between the two variable resistors 10 and 11, a third variable resistor 9 is placed and grounded via a line 13. The relationship among the resistances R1Ω for the resistor 10, the resistance R2Ω for the resistor 11, the resistance R3Ω for the resistor 9, the attenuation L dB and the impedance Z Ω are expressed by the above Equation (2). The R1 resistor 10, R2 resister 11 and R3 resistor 9 are related in their resistance values. In other words, the resistance value of the resistors 9–11 is changed in a related manner.

Figure 4:
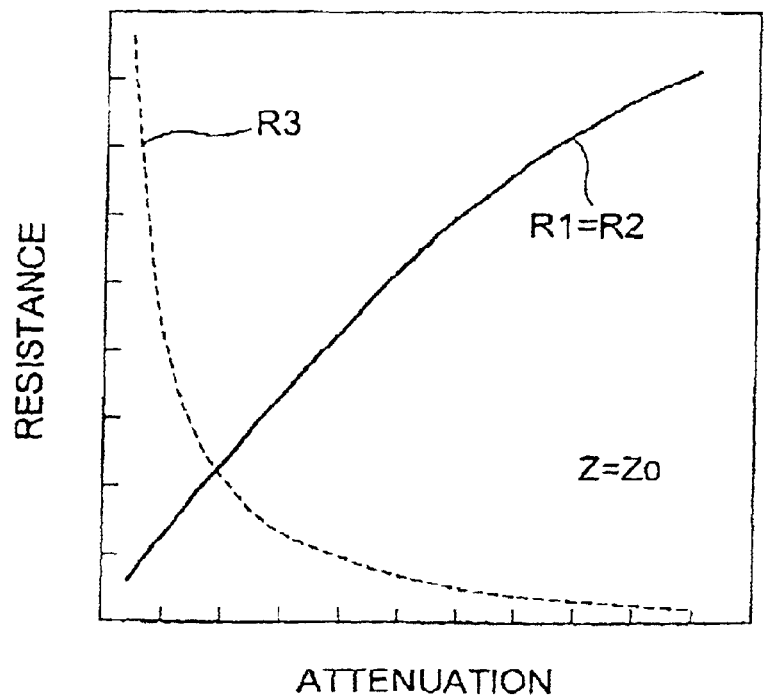
FIG. 4 is a graph illustrating a relationship between a resistance value and an attenuation value among a first resistor, a second resister and a third resistor in the preferred embodiment of the attenuator according to the current invention.

Now referring to FIG. 4, a graph illustrates a relationship between a resistance value and an attenuation value among the RI resistor 10, R2 resister 11 and R3 resistor 9 in the preferred embodiment of the attenuator according to the current invention. In general, the relationship between the resistance and the attenuation indicates that impedance is constant. That is, as the attenuation increases, the resistance R1=R2 increases substantially in a proportional manner while the resistance R3 decreases substantially in a hyperbolic manner. The relationship between the resistance R1=R2 and the resistance R3 is substantially inverse. For the above reasons, the following relationship is approximated:

$$C \approx (R1=R2)/R3 \qquad (3)$$

where C is a constant. To adjust the attenuation in the preferred embodiment of the attenuator according to the current invention, the resistance in any one of the three resistors, the R1 resistor 10, R2 resister 11 and R3 resistor 9 is modified, and the above relationship as expressed in Equation (3) is maintained.

Figure 5:
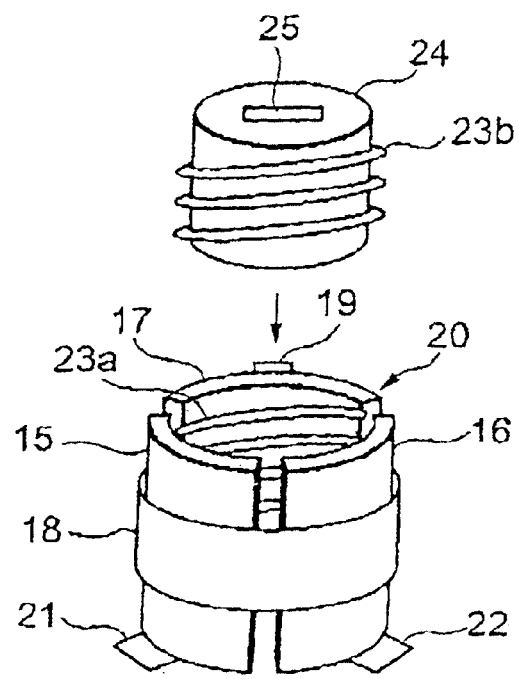
FIG. 5 is a diagram illustrating a prospective view of one exemplary implementation of the variable attenuator according to the current invention.

Now referring to FIG. 5, a diagram illustrates a prospective view of one exemplary implementation of the variable attenuator according to the current invention. The exemplary implementation of the preferred embodiment includes three resistors 15, 16 and 17 that share a common curvature and form a cylinder 20 around a single axis. The two resistors 15 and 16 each have vertical edges that are parallel to a central axis of the cylinder 20, and the width of the transistors 15 and 16 remain constant. A band 18 is placed around the three resistors 15, 16 and 17 to stabilize the relative position of the three resistors 15, 16 and 17. On an inner surface of the three resistors 15, 16 and 17, a plurality of grooves 23a is placed. On one end of the resistor 17, a grounded lead line 19 is placed while terminals 21 and 22 are respectively place on the other end of the resistors 15 and 16. The above cylinder 20 receives a movable fitting piece 24 to move along a vertical axis as the thread 23b engages the grooves 23a and the movable fitting piece 24 is rotated. The movable fitting piece 24 further includes a groove 25 on a top surface and or a bottom surface to accept a screwdriver tip to rotate the movable fitting piece 24. The movable fitting piece 24 is made of a high-electrical conductance material such as copper.

Figure 6:
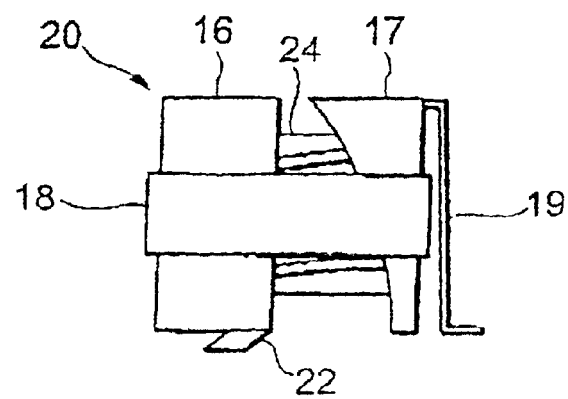
FIG. 6 is a diagram illustrating a side view of the above exemplary implementation of the variable attenuator according to the current invention.

Now referring to FIG. 6, a diagram illustrates a side view of the above exemplary implementation of the variable attenuator according to the current invention. In the side view, only two of the three resistors 16 and 17 are shown, and the resistor 15 is hidden in the view. The movable fitting piece 24 is placed in a space inside the cylinder 20 and moves vertically within the space as it is rotated. The resistor 16 has a vertical edge that is parallel to the central axis of the cylinder 20 while the resistor 17 has a curved side edge that is not parallel to the central axis of the cylinder 20. In other words, the width of the resistors 15 and 16 remain constant along the central axis of the cylinder 20. On the other hand, the width of the resistor 17 varies along the central axis of the cylinder 20. The edges on the resistor 17 have lines that are defined by a quadratic curve function. Consequently, the area that corresponds to the resistance value in the resistor 17 does not necessarily increase or decrease in a linear manner as the movable fitting piece 24 moves vertically along the central axis of the cylinder 20.

Now referring back to FIG. 5, in the above exemplary implementation, a combination of the resistor 15 and the movable fitting piece 24 corresponds to the variable resistor 10 while a combination of the resistor 16 and the movable fitting piece 24 corresponds to the variable resistor 11 of the preferred embodiment as shown in FIG. 3. Similarly, a combination of the resistor 17 and the movable fitting piece 24 corresponds to the variable resistor 9. The above terminals 21 and 22 respectively correspond to the terminals 110 and 120 while the lead line 19 corresponds to the line 13 in the preferred embodiment as shown in FIG. 3. The corresponding resistance value R1 is obtained at the terminal 21 due to the combination of the resistor 15 and the movable fitting piece 24. By the same token, the corresponding resistance value R2 is obtained at the terminal 22 due to the combination of the resistor 16 and the movable fitting piece 24. Lastly, the corresponding resistance value R3 is obtained at the lead line 19 due to the combination of the resistor 17 and the movable fitting piece 24.

Referring to FIG. 6, the movable fitting piece 24 vertically moves from a predetermined lowest position towards a predetermined highest position within the cylinder 20. As the movable fitting piece 24 vertically moves along the central axis of the cylinder 20, the resistance values R1 and R3 increase in a linear fashion while the resistance value R3 decreases in a non-linear fashion. As the movable fitting piece 24 vertically moves from the lowest position towards the highest position within the cylinder 201, the resistance value R3 changes at a high rate when the movable fitting piece 24 is near the lowest bottom position. However, the rate of change in the resistance value R3 decreases in an inverse manner as the movable fitting piece 24 further moves away from the bottom position. During the above vertical movement of the fitting piece 24, the impedance remains constant at a certain value. The above described relationships among the resistance values R1, R2 and R3 have been already depicted the graph as shown in FIG. 4.

Figure 7:
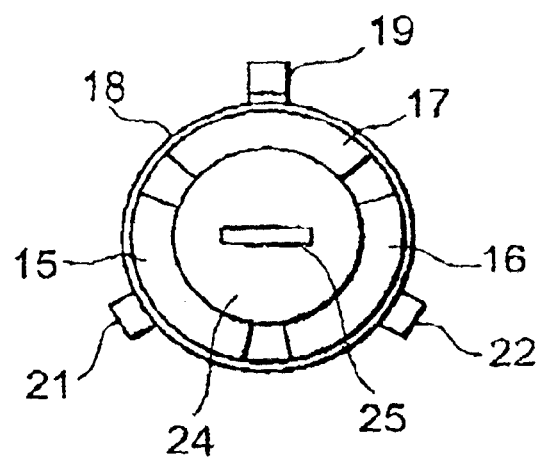
FIG. 7 is a diagram illustrating a top view of the above exemplary implementation of the variable attenuator according to the current invention.

Now referring to FIG. 7, a diagram illustrates a top view of the above exemplary implementation of the variable attenuator according to the current invention. In the top view, the movable fitting piece 24 is inserted in a cylindrical bore that is formed by the three resistors 15, 16 and 17. The circular band 18 holds the three resistors 15, 16 and 17 at a predetermined relative position. The inserted movable fitting piece 24 contacts the inner walls of the three resistors 15, 16 and 17. The inserted movable fitting piece 24 has a slit or groove on a top surface, and the movable fitting piece 24 is rotated by engaging a screw driver in the slit to modify the relative position of the movable fitting piece 24 with respect to the resistors 15, 16 and 17. Due to the relative position of the movable fitting piece 24, the attenuation is adjusted while the impedance is maintained. Outside the circular band 18, three terminals 21, 22 and 19 are respectively placed near the resistors 15, 16 and 17. In an alternative implementation, the resistors 15, 16 and 17 are formed into a single unit without the use of the circular band 18, and the gap between the resistors 15, 16 and 17 is filled non-conductive material.

Figure 8:
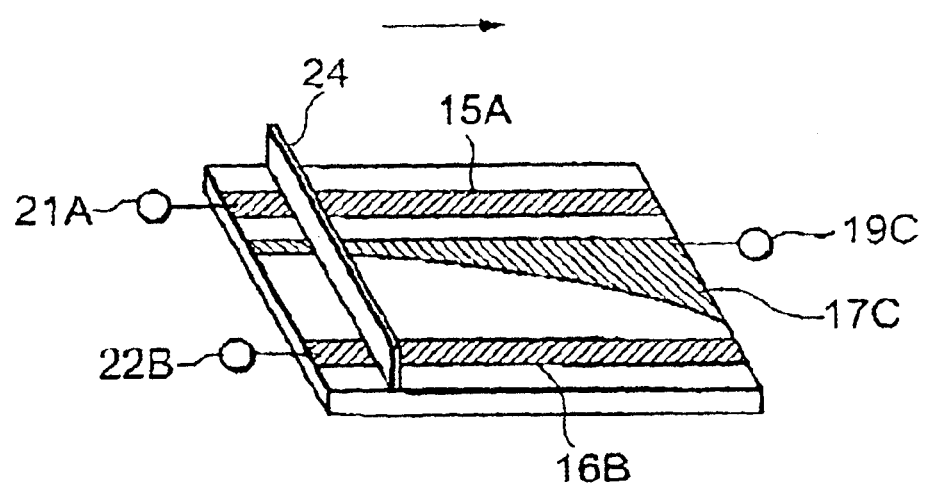
FIG. 8 is a diagram illustrating a prospective view of another exemplary implementation of the variable attenuator according to the current invention.

Now referring to FIG. 8, a diagram illustrates a prospective view of another exemplary implementation of the variable attenuator according to the current invention. In the alternative implementation, a slider or moving piece 24 moves across the surface where three resistors 15A, 16B and 17C are located. The resistors 15A and 16B are substantially rectangular and each have a constant width along either direction of the rectancular surface. On the other hand, the resistor 17C has a variable width at least in one direction. The width of the resistor 17C increases in the direction as indicated by an arrow. Terminals 21A, 22B and 19C are respectively placed near the corresponding resistors 15A, 16B and 17C.

Still referring to FIG. 8, the resistance value is adjusted by the position of the slider 24. As the slider 24 moves from one end to the other as indicated by the arrow, the resistance value in the three resistors 15A, 16B and 17C changes in a manner that is substantially similar to that of the resistors 15, 16 and 17 in the above implementation as shown in FIGS. 5 through 7. That is, the resistance value of the resistors 15A and 16B increases at the terminals 21A and 22B in a substantially linear manner as the slider 24 moves to the right, and the two resistance values R1 and R2 are substantially identical in value. On the other hand, the resistance value R3 of the resistor 17 decreases at the terminal 19C in a substantially inverse manner as the slider 24 moves to the right. As the attenuation increases as shown in FIG. 4, the resistance value R1 and R2 proportionally increases while the resistance value R3 inversely decreases. During the above change, the impedance remains substantially constant. Thus, the attenuation is adjusted while the impedance is kept constant.

It is to be understood, however, that even though numerous characteristics and advantages of the present invention have been set forth in the foregoing description, together with details of the structure and function of the invention, the disclosure is illustrative only, and that although changes may be made in detail, especially in matters of shape, size and arrangement of parts, as well as implementation in software, hardware, or a combination of both, the changes are within the principles of the invention to the full extent indicated by the broad general meaning of the terms in which the appended claims are expressed.

What is claimed is:

1. A method of varying an attenuation level with respect to impedance in an attenuator, comprising the steps of:

forming a first variable resistor, a second variable resistor and a third variable resistor each in a partial cylindrical surface that shares a common central axis;

placing a substantially identical pair of the first variable resistor and the second variable resistor in series in the attenuator;

grounding the third variable resistor between the first variable resistor and the second variable resistor;

varying resistance of the first variable resistor and the second variable resistor in a substantially identical and linear manner; and further varying resistance of the third variable resistor concurrently with the first variable resistor and the second resistor in a substantially inverse manner to adjust the attenuation while the impedance amount is maintained at a constant level.

2. The method of varying an attenuation level with respect to an impedance amount in an attenuator according to claim 1 wherein the inverse manner is quadratic and non-linear.

3. The method of varying an attenuation level with respect to an impedance amount in an attenuator according to claim 2 wherein the first variable resistor and the second variable resistor have an identical partial cylindrical surface whose pair of edges is parallel to the central axis, the third variable resistor having another cylindrical surface whose width increases along the central axis.

4. The method of varying an attenuation level with respect to an impedance amount in an attenuator according to claim 1 wherein the cylindrical surface is contacted by a common fitting movable piece that moves vertically along the central axis to vary the resistance of the first variable resistor, the second variable resistor and the third variable resistor.

5. The method of varying an attenuation level with respect to an impedance amount in an attenuator according to claim 1 wherein the first variable resistor, the second variable resistor and the third variable resistor form a part of a flat surface along a predetermined axis.

6. The method of varying an attenuation level with respect to an impedance amount in an attenuator according to claim 5 wherein the first variable resistor and the second variable resistor have an identical rectangular surface, the third variable resistor having another surface whose width increases along the predetermined axis.

7. The method of varying an attenuation level with respect to an impedance mount in an attenuator according to claim 6 wherein the flat surface is contacted by a common fitting movable piece that moves along the predetermined axis to vary the resistance of the first variable resistor, the second variable resistor and the third variable resistor.

8. An attenuator for varying an attenuation level with respect to impedance, comprising:

a first variable resistor having a cylindrical shape for varying with a first range of resistance;

a second variable resistor connected in series with said first variable resistor having the cylindrical shape for varying with the first range of resistance;

a third variable resistor grounded and connected between said first variable resistor and said second variable resistor having a cylindrical shape for varying with the second range of resistance, said first variable resistor, said second variable resistor and said third resistor forming a cylinder and sharing a common central axis, wherein said first variable resistor and said second variable resistor have an identical partial cylindrical surface whose pair of edges is parallel to the central axis, said third variable resistor having another cylindrical surface whose width increases along the central axis; and a movable fitting piece placed in the cylinder for moving along the central axis to vary the resistance of the first variable resistor and the second variable resistor in a substantially identical and linear manner, said movable fitting piece concurrently varying the resistance of the third variable resistor with the first variable resistor and the second resistor in a substantially inverse manner to adjust the attenuation while the impedance is maintained at a constant level.

9. The attenuator for varying an attenuation level with respect to impedance according to claim 8 wherein said movable fitting piece varies the resistance of the third variable resistor in a substantially quadratic and non-linear manner.

10. An attenuator for varying an attenuation level with respect to impedance, comprising:

a board having a flat surface along a predetermined axis;

a first variable resistor located on said board and having a rectangular shape for varying with a first range of resistance;

a second variable resistor located on said board and connected in series with said first variable resistor, said second variable resistor having the rectangular shape for varying with the first range of resistance;

a third variable resistor located on said board being grounded at one end, the other end of said third variable resistor being connected between said first variable resistor and said second variable resistor, said third variable resistor having a predetermined shape for varying with the second range of resistance; and a movable fitting piece placed on said board for contacting said first variable resistor, said second variable resistor and said third variable resistor, said movable fitting piece moving along the central axis to vary the resistance of said first variable resistor and said second variable resistor in a substantially identical and linear manner, said movable fitting piece concurrently varying the resistance of said third variable resistor with the resistance of said first variable resistor and said second resistor in a substantially inverse manner to adjust the attenuation while the impedance is maintained at a constant level.

11. The attenuator for varying an attenuation level with respect to impedance according to claim 10 wherein said movable fitting piece varies the resistance of the third variable resistor in a substantially quadratic and non-linear manner.

12. The attenuator for varying an attenuation level with respect to impedance according to claim 10 wherein said first variable resistor and said second variable resistor have an identical rectangular surface, said third variable resistor having another surface whose width increases along the predetermined axis.

* * * * *